(12) United States Patent
Tseng

(10) Patent No.: US 6,368,973 B1
(45) Date of Patent: Apr. 9, 2002

(54) METHOD OF MANUFACTURING A SHALLOW TRENCH ISOLATION STRUCTURE

(75) Inventor: Horng-Huei Tseng, Hsinchu (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/668,933

(22) Filed: Sep. 25, 2000

(51) Int. Cl.[7] ............ H01L 21/302; H01L 2/3065; H01L 21/461

(52) U.S. Cl. ............ 438/692; 438/699; 438/700; 438/706; 438/745

(58) Field of Search ............ 438/700, 745, 438/706, 692, 699

(56) References Cited

U.S. PATENT DOCUMENTS

| | | | | |
|---|---|---|---|---|
| 5,567,640 A | * | 10/1996 | Tseng | 438/396 |
| 5,868,870 A | * | 2/1999 | Fazan et al. | 148/33.3 |
| 5,940,716 A | * | 8/1999 | Jin et al. | 438/424 |
| 5,950,093 A | * | 9/1999 | Wei | 438/401 |
| 5,963,819 A | * | 10/1999 | Lan | 438/424 |

* cited by examiner

Primary Examiner—Benjamin L. Utech
Assistant Examiner—Lynette T. Umez-Eronini
(74) Attorney, Agent, or Firm—J. C. Patents

(57) ABSTRACT

A method of manufacturing a shallow trench isolation structure. A pad oxide layer is formed on a substrate, and a mask layer is formed on the pad oxide layer. Next, using a photoresist having opening patterns as a mask, the mask layer and the pad oxide layer are etched, and a trench is formed within the substrate. Thereafter, the photoresist is laterally etched, thereby causing the photoresist openings to enlarge. Next, the mask layer exposed by the openings is etched, thereby forming a wide opening in the mask layer. Subsequently, the photoresist layer is removed, and the insulation layer is formed on the upper portion of the mask, within the wide opening and inside trench. Next, using the mask layer as the polishing stop layer, a chemical mechanical polish procedure is performed, thereby removing a portion of the insulation layer, exposing the mask layer and an even surface is achieved. Thereafter, the mask layer and a portion of the pad oxide layer are removed, thereby forming a T-shaped shallow trench isolation structure.

17 Claims, 6 Drawing Sheets

METHOD OF MANUFACTURING A SHALLOW TRENCH ISOLATION STRUCTURE

BACKGROUND OF THE INVENTION

1. Field of the Invention

The present invention relates to a method of manufacturing an isolation structure for an integrated circuit device. More particularly, the present invention relates to a method of manufacturing a shallow trench isolation structure for an integrated circuit device.

2. Description of the Related Art

Shallow trench isolation uses an anisotropic etching process to form a trench in the semiconductor substrate and subsequently, filling in the trench with a chemical in order to form a field isolation region technique of the device. Since the field isolation region formed by the shallow trench isolation process has the advantages of scalability, as well as being able to prevent the disadvantageous bird's beak encroachment, therefore, in terms of the sub-micron CMOS process, this is a relatively ideal isolation technique.

FIGS. 1A to 1F are flow chart diagrams in cross-sectional view, illustrating a method of manufacturing shallow trench isolation region in the prior art.

Referring to FIG. 1A, first, using thermal oxidation, a pad oxide 102 is formed on a silicon substrate 100. A silicon nitride mask layer 104 is formed on the pad oxide 102, and a conventional technique is used to define the mask layer 104 and the pad oxide 102, thereby defining the isolation region of the device.

Next, referring to FIG. 1B, using a conventional technique, a photoresist (not illustrated) is formed on the surface of the silicon nitride mask layer. Also, the silicon nitride mask layer 104, pad oxide 102 and silicon substrate 100 are successively etched, thereby forming a trench 106 within the silicon substrate 100. Thereafter, the photoresist is removed.

Referring to FIG. 1C, using chemical vapor deposition (CVD), an insulation layer 112 is filled into the silicon substrate exposed by the trench 106.

Referring to FIG. 1D, using the silicon nitride mask layer 104 as the polishing stop layer, using chemical mechanical polishing (CMP) to remove the excess insulation layer 112 above the silicon nitride mask layer 104, thereby leaving behind the insulation layer 114 within the trench 106.

Subsequently, referring to FIG. 1E, a wet etching procedure is used to remove the mask layer 104. Due to the factor of isotropic etching, the insulation layer 114 covered by the edges of the trench 106 vertex results in the creation of a depression 11, and leaves behind the insulation layer 114a.

Referring to FIG. 1F, the pad oxide layer 102 is removed by using a wet etching procedure. Conventionally, the insulation layer 114a is made of a silicon oxide material. Since the etching characteristics of the material and the etching characteristics of the pad oxide layer 102 are similar, therefore, during the removal process of the pad oxide layer, a portion of the insulation layer will also be etched away, thereby forming insulation layer 114b.

Due to the factor of isotropic etching, the above-described depression 11 will become more serious and form an even deeper and wider depression 13. The depression 13 exposes the trench 106 vertex, causing a "kink effect" of the sub-threshold voltage on the surface of the NMOS that is formed, an effect that increases leakage during threshold conditions.

SUMMARY OF THE INVENTION

The invention provides a shallow trench isolation manufacturing method. A T-shaped insulation layer is formed on the shallow trench and on a portion of the pad oxide layer, wherein the T-shaped insulation layer can prevent the trench vertex from being exposed during the wet etching procedure, preventing the device from the occurrence of a kink effect.

As embodied and broadly described herein, the invention provides a shallow trench isolation manufacturing method. The manufacturing method comprises forming a pad oxide layer on the substrate, and forming a mask layer on the pad oxide layer. Next, using a photoresist with opening patterns as a mask, the mask layer and the pad oxide layer are etched, and a trench is formed in the substrate. Thereafter, the photoresist is laterally etched, in order to expand the photoresist opening. Next, the mask layer exposed by the photoresist opening is etched, thereby forming a wide opening within the mask layer. Subsequently, the photoresist is removed, thereby exposing the T-shaped opening constructed by the trench and the wide opening of the mask layer. An insulation layer is formed on the upper portion of the mask layer, within the wide opening and inside the trench. Next, using the mask layer as a polishing stop layer to perform a CMP process, a portion of the insulation layer is removed, thereby exposing the mask layer and creating an even surface. Next, the mask and a portion of the pad layer are removed, thereby forming a T-shaped shallow trench isolation structure.

According to the descriptions of the present embodiment, the insulation layer formed by the above-described method covers the edges of the trench vertex. Therefore, in the successive removal of the mask layer and the pad layer during the wet tching procedure, the insulation layer covering the edges of the trench vertices can rotect the trench vertices, so that it is not exposed due to the factor of isotropic etching. Hence, the present invention can prevent the kink effect from occurring.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

FIGS. 2A to 2H are flow diagrams in cross-sectional view, illustrating a method of manufacturing a shallow trench isolation structure, according to one preferred embodiment of this invention.

Figure 1A:
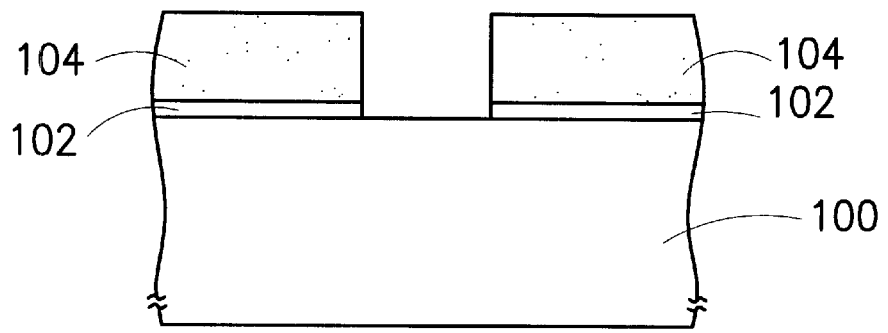
FIGS. 1A to 1F are flow diagrams in cross-sectional view, illustrating a method of manufacturing a conventional shallow trench insulation structure.
Figure 1B:
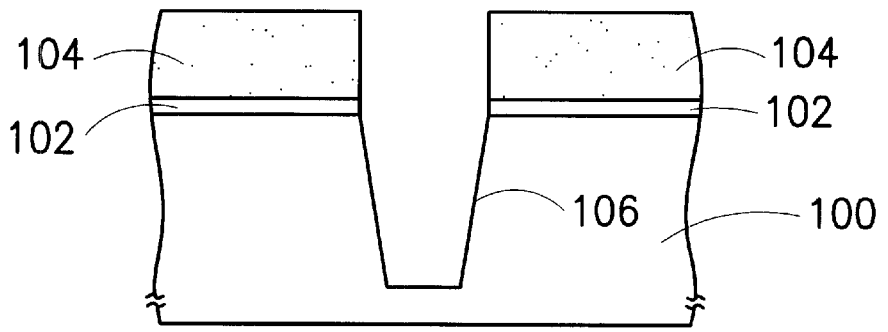
Figure 1C:
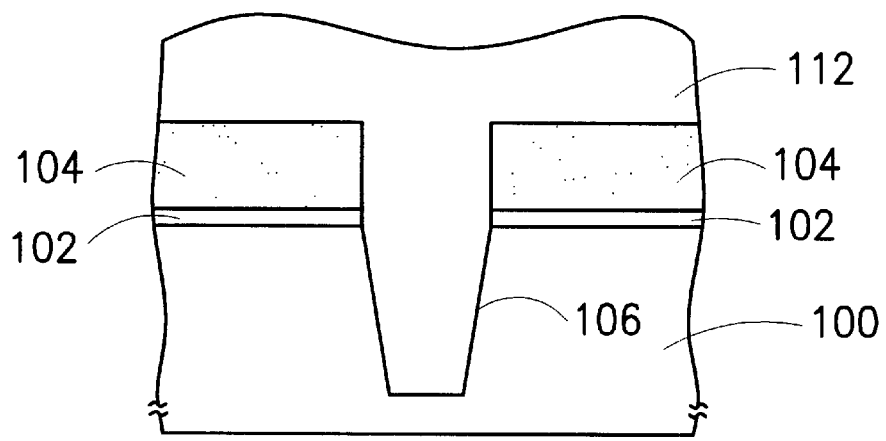
Figure 1D:
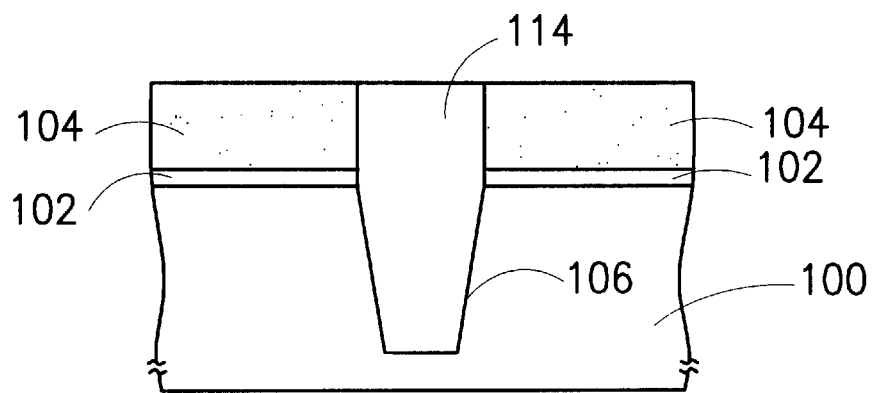
Figure 1E:
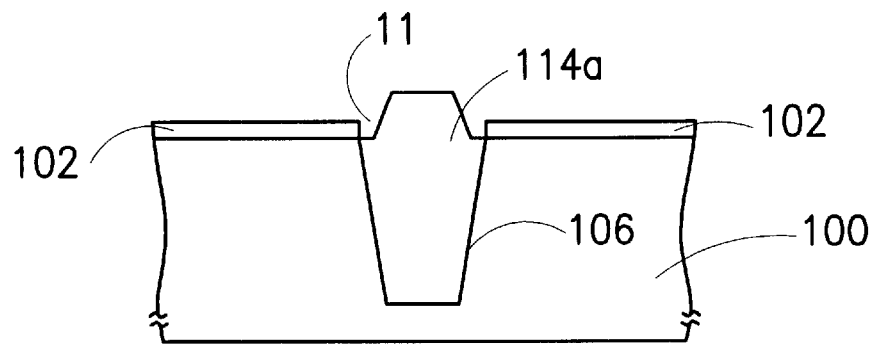
Figure 1F:
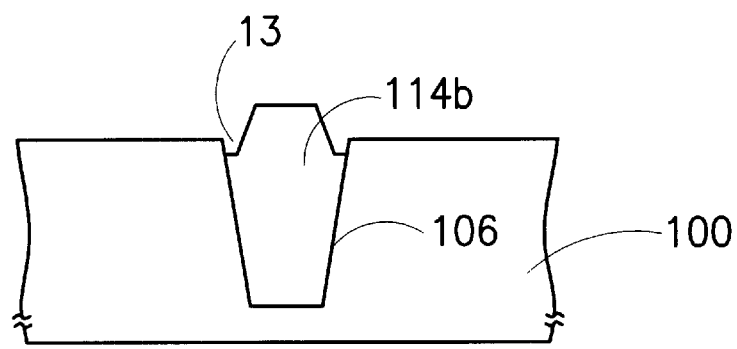
Figure 2A:
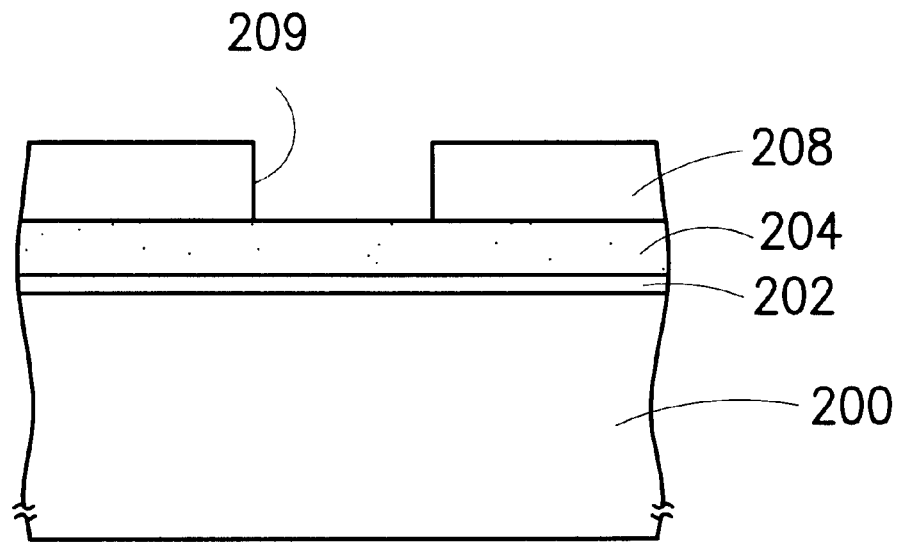
FIGS. 2A to 2H are flow diagrams in cross-sectional view, illustrating a method of manufacturing a shallow trench isolation structure, according to one preferred embodiment of this invention.

Referring to FIG. 2A, using a thermal oxidation process, a pad oxide chemical layer 202 is formed on a silicon substrate 200, wherein the pad oxide layer 202 is used to protect the surface of the silicon substrate 200 during the process. Next, a mask layer 204 is formed on the pad oxide layer. The mask layer 204 is made of a material such as silicon nitride or polysilicon, formed via a method such as CVD, having a thickness of about 200 Å to 2000 Å. Subsequently, the prior art technique is used to form a photoresist 208 on the surface of the mask layer 204. The photoresist 208 has an opening 209, used for defining the desired position for forming the isolation structure.

Figure 2B:
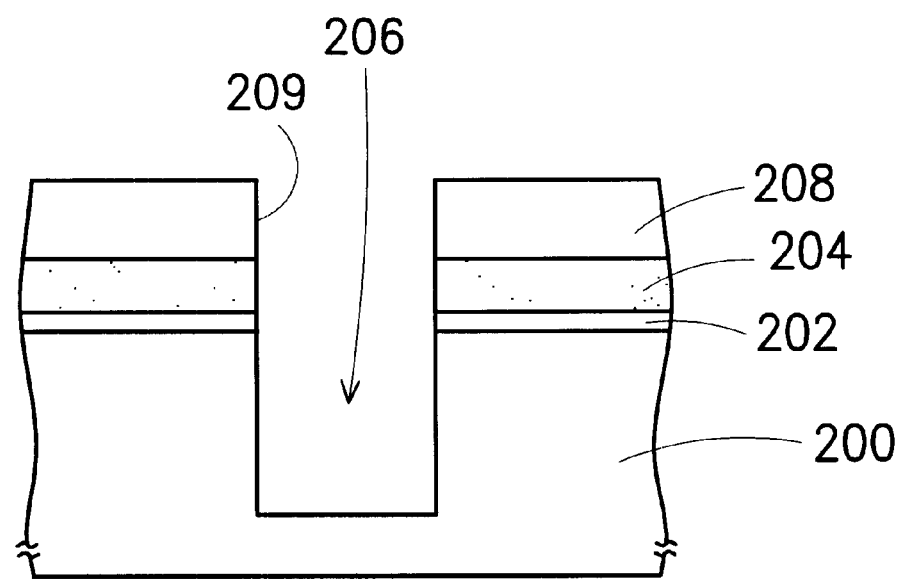

Referring to FIG. 2B, using the photoresist 208 with opening 209 as a mask, the silicon nitride layer 204 exposed by the opening 209, as well as the pad oxide layer 202 and the silicon substrate 200 located below the silicon nitride layer 204 are successively etched. The etching process can be anisotropic etching procedure, for example, thereby forming a trench 206 within the silicon substrate 200. The depth of the trench 206 is from about 015 µm to 0.65 µm.

Figure 2C:
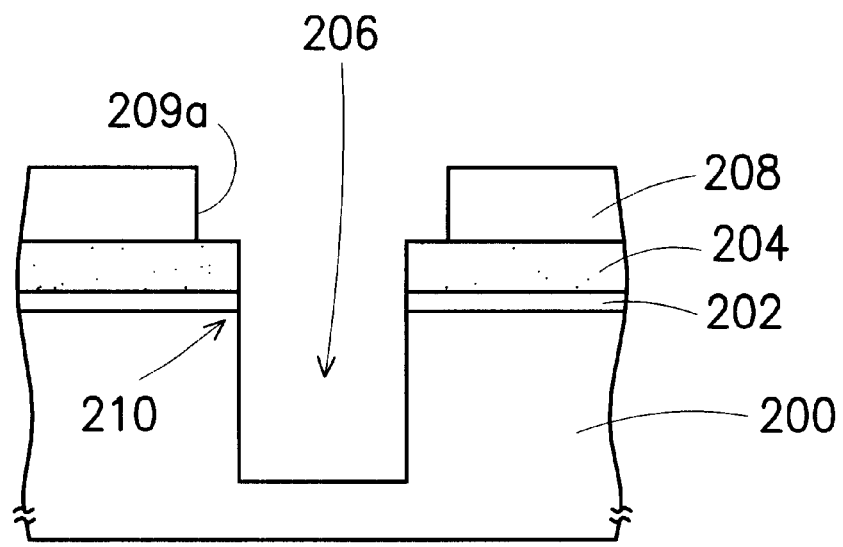

Referring to FIG. 2C, the photoresist 208 is isotropic laterally etched, thereby causing the opening 209 of the photoresist to enlarge, and forming opening 209a. The opening 209a exposes a portion of the mask layer 204 beside vertex peripheral edges 210 of the trench 206. The isotropic lateral etching can be, for example, using a process that at least contains oxygen plasma.

Figure 2D:
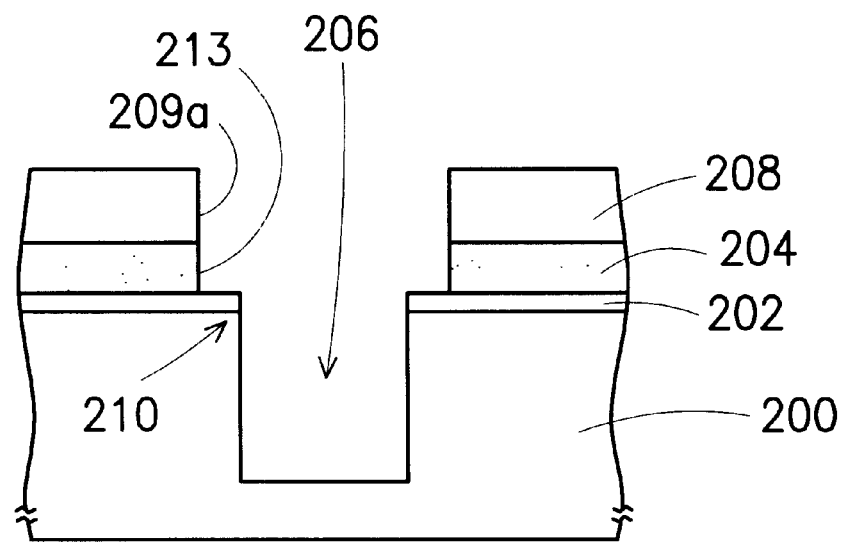

Referring to FIG. 2D, using the photoresist 208 as a mask, the mask layer 204 not covered by the photoresist 208 is etched away. Hence, an opening 213 is formed within the mask layer 204, and a portion of the pad oxide layer 202 beside the vertex peripheral edges 210 of the trench 206 is exposed.

Figure 2E:
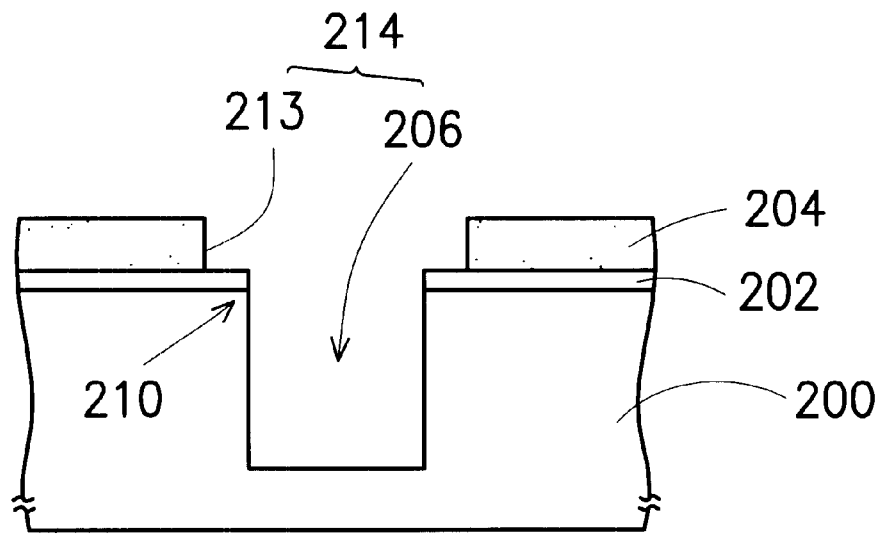

Referring to FIG. 2E, the photoresist 208 is removed, thereby exposing a T-shaped cross-sectional opening 214 formed by the wide opening 213 of the mask layer 204 and the trench 206.

Figure 2F:
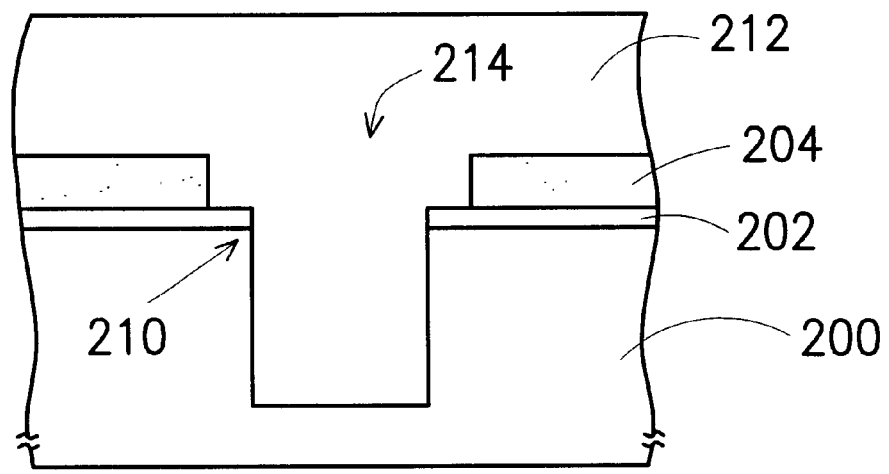

Referring to FIG. 2F, an insulation layer 212 is covered on the mask layer 204 and within the T-shaped opening 214. The insulation layer 212 can be made of a material such as silicon dioxide, and can be made via a process such as using $SiH_4$ or TEOS as a reactive gas, using plasma-enhanced chemical vapor deposition (PECVD) or using high density plasma chemical vapor deposition (HDCVD). In a preferred process, a high thermal densification process is performed, thereby causing the insulation layer 212 formed by the silicon dioxide to be even more dense.

Figure 2G:
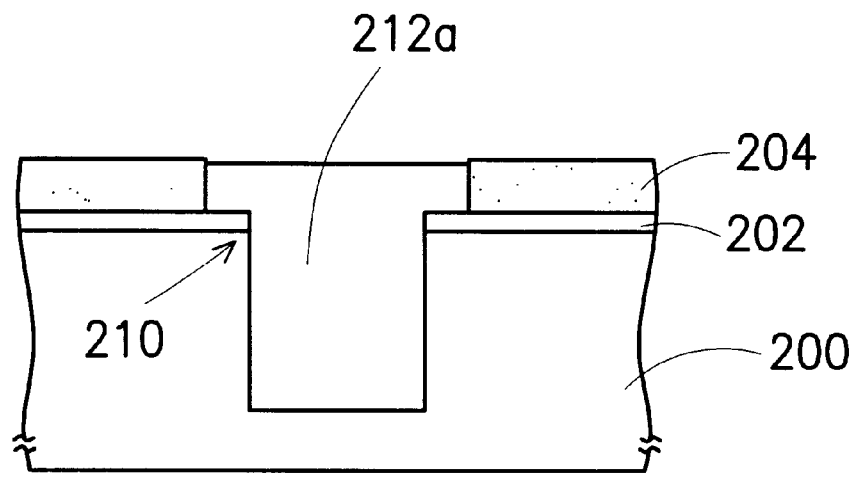

Referring to FIG. 2G, using the mask layer 204 as a polishing stop layer, a CMP procedure is performed, thereby removing a portion of the insulation layer 212 and exposing the mask layer 204. Thus, the remaining insulation layer 212a in the T-shaped opening 214 to reveal the T-shaped cross-section and that it has an even surface.

Figure 2H:
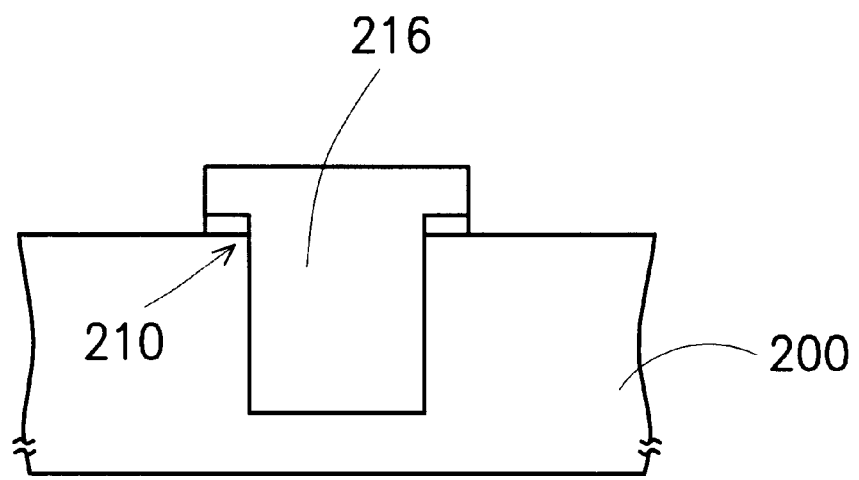

Lastly, referring to FIG. 2H, the mask layer 204 and the pad oxide layer 202 not covered by the insulation layer 212a is removed. The removal process of the mask layer 204 includes a wet etching procedure, such as by using thermal phosphoric acid removal material as the silicon nitride mask layer 204. After removing the mask layer, and using a wet etching process, such as via use of hydrofluoric acid, the pad oxide 202 is removed, thereby forming a t-shaped shallow trench isolation structure 216.

In the method of manufacturing the shallow trench isolation structure of the present invention, the filled-up insulation layer within the trench can cover the vertex peripheral edges. Consequently, in successive wet etching procedures for removing the mask layer and the pad oxide layer, the insulation layer covering the vertex peripheral edges of the trench can protect the trench vertices, so that the vertices are not exposed due to the factor of isotropic etching. Therefore, the present invention can prevent the occurrence of a kink effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a shallow trench isolation structure, comprising:

providing a substrate;

forming a pad oxide layer on the substrate;

forming a mask layer on the pad oxide layer;

forming a photoresist layer on the mask layer, wherein the photoresist has a first opening;

etching the mask layer and the pad oxide layer by using the photoresist layer as a mask, to form a trench within the substrate;

laterally etching the photoresist layer, thereby causing the first opening of the photoresist layer to enlarge to form a second opening, wherein the second opening exposes a portion of the mask layer beside vertex peripheral edges of the trench;

etching the portion of the mask layer exposed by the second opening of the photoresist layer to form a third opening in the mask layer, wherein the third opening exposes a portion of the pad oxide layer beside the vertex peripheral edges of the trench;

removing the photoresist layer to form a T-shaped cross-sectional opening by the third opening and the trench;

forming an insulation layer on the mask layer and within the T-shaped cross-sectional opening;

removing the insulation layer covered on top of the mask layer;

removing the mask layer; and removing the pad oxide layer, thereby forming a T-shaped isolation structure.

2. The method of manufacturing a shallow trench isolation structure as defined in claim 1, wherein the pad oxide formation process includes thermal oxidation.

3. The method of manufacturing a shallow trench isolation structure as defined in claim 1, wherein a material of the mask layer includes silicon nitride.

4. The method of manufacturing a shallow trench isolation structure as defined in claim 1, wherein a material of the mask includes polysilicon.

5. The method of manufacturing a shallow trench isolation structure as defined in claim 1, wherein a thickness of the mask layer is from about 200 Å to 2000 Å.

6. The method of manufacturing a shallow trench isolation structure as defined in claim 1, wherein the laterally etching process of the photoresist includes isotropic etching.

7. The method of manufacturing a shallow trench isolation structure as defined in claim 1, wherein the etching portion of the mask layer exposed by the second opening includes anisotropic etching.

8. The method of manufacturing a shallow trench isolation structure as defined in claim 1, wherein removing of the insulation layer covering on top of the mask layer includes chemical mechanical polishing.

9. The method of manufacturing a shallow trench isolation structure as defined in claim 1, wherein removing of the mask layer includes wet etching.

10. The method of manufacturing a shallow trench isolation structure as defined in claim 1, wherein the removal process of a portion of the pad oxide layer includes wet etching.

11. A method of manufacturing a shallow trench isolation structure, comprising:

providing a substrate;

forming a pad oxide layer on the substrate;

forming a mask layer on the pad oxide layer;

forming photoresist on the mask layer, wherein the photoresist has a first opening, thereby exposing the mask layer;

using the photoresist as a mask layer, wherein the mask layer and the pad oxide layer are etched, and a trench is formed within the substrate;

performing anisotropic etching of the photoresist, thereby causing the first opening of photoresist to enlarge, and exposing a portion of the mask layer beside vertex peripheral edges of the trench;

performing anisotropic etching upon the portion of the mask layer exposed by the first opening of the photoresist to form a second opening in the mask layer, wherein the second opening exposes the pad oxide layer beside the vertex peripheral edges of the trench;

removing the photoresist;

forming an insulation layer on the substrate, thereby covering the mask layer, and filling in the second opening and the trench;

using a chemical mechanical polishing procedure to remove the insulation layer covering above the mask layer, thereby causing a residual insulation layer to fill in the trench and extend out above the vertex peripheral edges of the trench;

using a wet etching procedure to remove the mask layer; and using a wet etching procedure to remove the pad oxide layer not covered by the insulation layer.

12. The method of manufacturing the shallow trench isolation structure as defined in claim 11, wherein the anisotropic etching process of the photoresist includes oxygen plasma lateral etching of the photoresist.

13. The method of manufacturing the shallow trench isolation structure as defined in claim 11, wherein the anisotropic etching process of the mask layer exposed by the first opening of the photoresist includes dry plasma etching.

14. The method of manufacturing the shallow trench isolation structure as defined in claim 11, wherein a material of the mask layer includes silicon nitride.

15. The method of manufacturing the shallow trench isolation structure as defined in claim 11, wherein a material of the mask layer includes polysilicon.

16. The method of manufacturing the shallow trench isolation structure as defined in claim 11, wherein the wet etching procedure to remove the mask layer is via use of thermal phosphoric acid.

17. The method of manufacturing the shallow trench isolation structure as defined in claim 11, wherein the wet etching procedure to remove the pad oxide layer is via use of hydrofluoric acid.

* * * * *